(12) United States Patent
Horoschenkoff et al.

(10) Patent No.: US 7,053,528 B2
(45) Date of Patent: May 30, 2006

(54) TORSION ELEMENT AND TORSION ACTUATOR

(75) Inventors: Alexander Horoschenkoff, Taufkirchen (DE); Joerg Zuerner, Gerlingen (DE)

(73) Assignee: EADS Deutschland GmbH, Ottobrunn (DE)

( * ) Notice: Subject to any disclaimer, the term of this patent is extended or adjusted under 35 U.S.C. 154(b) by 0 days.

(21) Appl. No.: 10/382,602

(22) Filed: Mar. 6, 2003

(65) Prior Publication Data
US 2003/0218405 A1 Nov. 27, 2003

(30) Foreign Application Priority Data
Mar. 7, 2002 (DE) .................. 102 09 906

(51) Int. Cl.
*H01L 41/08* (2006.01)
*H01L 41/04* (2006.01)
(52) U.S. Cl. .................... 310/333; 310/328
(58) Field of Classification Search ............ 310/328, 310/333, 363–367, 370, 323; H01L 41/08, H01L 41/04
See application file for complete search history.

(56) References Cited

U.S. PATENT DOCUMENTS

| 5,552,658 | A | * | 9/1996 | Dibbern et al. ............. 310/366 |
| 5,786,655 | A | * | 7/1998 | Okumura et al. ........... 310/333 |
| 6,952,072 | B1 | * | 10/2005 | Iino et al. .............. 310/323.04 |

FOREIGN PATENT DOCUMENTS

| DE | 4033089 | * | 10/1990 | .................... 41/4 |
| DE | 4033089 | * | 3/1992 | |

* cited by examiner

*Primary Examiner*—Darren Schuberg
*Assistant Examiner*—Karen Addison
(74) *Attorney, Agent, or Firm*—Davidson, Davidson & Kappel, LLC

(57) ABSTRACT

A torsion element includes a torsionally soft, flexurally stiff torsion rod, a plurality of piezoceramic fibers wound on the torsion rod, and a plurality of electrodes wound on the torsion rod cross-wise at an angle a with the respect to the plurality of piezoceramic fibers and electrically contacting the piezoceramic fibers. In addition, a torsional actuator including such a torsion element clamped in a fixed bearing and the free end(s) being operatively connected to a gearing for converting the motion.

14 Claims, 2 Drawing Sheets

TORSION ELEMENT AND TORSION ACTUATOR

This application claims priority to German Patent Application No. DE 102 09 906.5, Mar. 7, 2002, which is incorporated by reference herein.

BACKGROUND

The present invention relates to a torsion element made of a torsionally soft, flexurally stiff torsion rod having piezoceramic fibers wound thereon and of electrodes electrically contacting the piezoceramic fibers, and to a torsional actuator formed thereby.

In the actuator technology, there is frequently a need for actuating elements which are able to execute rapidly oscillating rotary motions in the medium and higher angular range. Thus, for example, to improve the aerodynamic conditions of profiles, such as rotor blades, with respect to oncoming flow, it is desired to move flaps with high actuation frequency using such torsional actuators.

A way to accomplish this is to make use of structural or material-related anisotropies by converting a longitudinal force on the upper or lower side of the rotor blade into a torsional motion of the rotor blade. In this context, the rotor blade is designed to be active itself; however, it must also be designed in such a manner that it is capable of supporting the prevailing wind loads. Another possibility is to integrate a torsional actuator into the rotor blade. In this case, the torsional actuator assumes the adjusting force and serves at the same time to take up the wind loads while the remaining structure of the rotor blade is relieved of this function.

In this context, a torsional actuator includes an active torsion element which generates the force and the actuating action when applying an electric voltage. Using further components of the torsional actuator, this actuating action is converted into an actuating force which is suitable for the respective application, including the required actuating angle, torque and frequency.

A torsion element having piezoceramic fibers wound on a torsion rod is known from German Patent DE 40 33 089 C1. In this context, in order to effect a twisting action on the torsion rod, the piezoceramic fibers are wound on the torsion rod at an angle, to be more precise, at an angle not equal to 90° with respect to the longitudinal axis of the torsion rod. A composite wrap in a 90° direction (directly transverse to the rod) would, after driving the piezoceramic fibers, produce a contraction thereof, and thus a compression of the diameter of the torsion rod, but not a torsion. This would only affect the damping behavior of the rod. The torsional power (torque) and the direction of torsion can be adjusted via the winding density of the piezoceramic fibers and the angle (pitch) between the winding direction and the longitudinal axis of the torsion rod.

In German patent DE 40 33 089 C1, the contacting of the piezoceramic fibers is implemented such that the fibers have an electrically conductive core and are embedded in an electrically conductive matrix so that the electrodes are run virtually parallel to the piezoceramic fiber. For control purposes, the respective core of each fiber must be directly contacted in order to apply a voltage between this core and the matrix.

However, in the manufacture of such a torsion element, this is extremely difficult in terms of process engineering so that often several fibers are not driven or fail during operation, resulting in a deterioration of the functioning of the torsion element.

SUMMARY OF THE INVENTION

An object of the present invention is to provide a torsion element in which the contacting of the piezoceramic fibers is simplified and less prone to malfunctions. An additional or alternative object of the present invention is to provide a torsional actuator which is formed by the torsion elements, which can be manufactured and used economically, and which has improved performance.

The present invention provides a torsion element made of a torsionally soft, flexurally stiff torsion rod having piezoceramic fibers wound thereon and of electrodes electrically contacting the piezoceramic fibers, wherein the piezoceramic fibers (30) and the electrodes (40) are wound crosswise, forming an angle a.

To this end, it may also be expedient if the electrodes are wound on the torsion rod in a simple elongated form, for example, as a wire or the like. In this context, the electrodes can be located above and/or below the piezoceramic fibers, the performance of the torsion element being controllable by the number of piezoceramic fibers.

One advantage of the torsion element according to the present invention is that the cross-winding of piezoceramic fibers and electrodes results in a simple contacting, which can be accomplished during manufacture by two simple winding operations. In this manner, low costs are incurred during manufacture. Moreover, the application of an electric voltage to the individual piezoceramic fibers is accomplished in a simple manner by the direct contact of the fibers with the electrodes. Furthermore, the contacting of the individual electrodes is unproblematic, since there no electrodes are located inside the piezoceramic fibers.

In the winding process, angles between 45° and 130° can be achieved in an advantageous manner; however, in a particularly preferred embodiment, the piezoceramic fibers and the electrodes form an angle of 90°. Technically, this is most easy to handle and the fiber sections between two electrodes are of an order of magnitude that can be readily handled. They are not too large, which would result in insufficient utilization of the piezoceramic fiber, but not too small either, which could result in short circuits between the electrodes.

For a universally controllable use of the torsion element, in particular in a torsional actuator, it is advantageously possible to apply electric voltage to the electrodes in sections along their longitudinal direction. In this context, only individual regions of the piezoceramic fibers or of the entire winding are driven and caused to contract or expand.

In this context, the sectional control can be implemented such that the electrodes are interrupted, for example, by non-conductive regions, and that each region is contacted separately. However, it is also possible to contact an electrode several times along its length and to apply electric voltage between the corresponding contacts as needed. In this manner, the positioning travel of the torsion element can be electronically adapted to the requirements without carrying out the whole rotary motion. Thus, the rotary motion can be adapted to the particular positioning path by electronic control without gearing, and the function of the gearing can be designed for other uses.

Preferably, the piezoceramic fibers and electrodes are electrically insulated from the torsion rod and/or from the environment. Insulation from the torsion rod is done if there is a risk of short circuits because of the conductivity of the torsion rod. Electrical insulation from the environment increases the possible uses of the torsion element in different media, since due to the insulation thereof, no interaction occurs with the medium. The insulation is preferably made of conventional insulation materials which are applied in layers. Alternatively, the insulation can also be accomplished by the plastic matrix in which the electrodes and the piezoceramic fibers are embedded.

The support in the torsion element according to the present invention is a torsionally soft but flexurally stiff torsion rod. For these requirements, the support is preferably manufactured from fiber-reinforced plastic, the fibers being aligned along the longitudinal direction of the torsion rod. Due to the alignment of the fibers in the longitudinal direction and the strength accompanying the fiber alignment, the torsion rod is provided with the required strength in the longitudinal direction. However, due to the lack of fibers in the circumferential direction, the torsion rod remains soft in this direction upon introduction of force, allowing torsion.

Alternatively, it is advantageous to distribute the requirements placed on the torsion rod among different parts, possibly made of different materials. To this end, the torsion rod includes a compressionally rigid, flexurally stiff core, which does not necessarily have to be torsionally soft. This function is assumed by a torsionally soft shell located above the core. In this context, the compressive and bending forces are introduced from the shell into the core, which receives these forces. The flexurally stiff core does not offer any resistance to the torsional forces since the torsional force is received by the torsionally soft shell and converted into a torsional motion.

Preferably, an additional, tough material is placed between the core and the torsionally soft shell, the tough material further supporting above-mentioned division of the functional requirements among the individual parts and materials. It is particularly preferred for the tough material to be an elastomer or foam.

The solution of the objective relating to the torsional actuator is characterized, according to the present invention, in that the torsion element is clamped in a fixed bearing and the free end(s) is/are operatively connected to a gearing for converting the motion.

In this context, the fixed bearing can be located at one end of the torsion element and the gearing at the other end; however, it is also possible to install the fixed bearing in the middle of the torsion element and to pick up the torsional force at both ends via gearings. In the first possibility, the maximum torsional path is used, whereas in the second possibility, two torsional motions can be picked up simultaneously; however, the maximum positioning travel per unit of length being halved in this case. However, this can be compensated for by the gearing if the picked-up force is reduced for this purpose.

For stabilization purposes, it is advantageous for the torsion element to be additionally supported in floating bearings between the fixed bearing and the free end(s). This provides additional support for the torsion element, reducing the risk of bending of the torsion rod in the torsion element, which would result in warping of the torsion element and in a reduction in efficiency. Moreover, using the floating bearing, it is possible to divide the torsion element into sectors (sections), and to contact and drive the electrodes section in sections via these sectors.

The gearing is preferably a gear mounted in a torsionally fixed manner, in particular, preferably one having a larger diameter than the torsion element itself. Using a large gear, the positioning travel of the torsional actuator that can be picked up is increased at the cost of actuating force. However, since piezoceramic actuators feature a high actuating force, this reduction in the absolute actuating force is acceptable.

For driving the torsional actuator, the actuator is preferably equipped with a control unit which, using means mounted at the gearing for angle measurement of the performed torsion and/or means for torque measurement, drives the electrodes in such a manner that the setpoint value is adjusted to the actual value. In the process, the electrodes are driven (also possibly in sections) until the desired torsion is produced. Through time-variant control, it is easily possible to produce a non-wearing, high-frequency, oscillating torsional motion having large actuating forces and angles of rotation.

BRIEF DESCRIPTION OF THE DRAWINGS

In the following, the present invention will be explained in greater detail by way of exemplary embodiments depicted in three drawings, in which.

DETAILED DESCRIPTION

Figure 1:
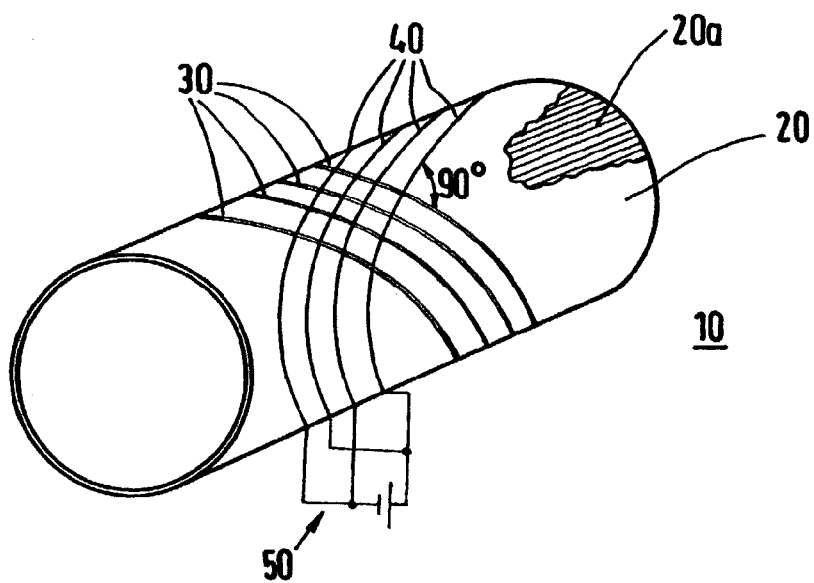
FIG. 1 shows a schematic design of a torsion element according to the present invention, including a torsion rod made of fiber-reinforced plastic.

Torsion element 10 shown in FIG. 1 includes a torsion rod 20 made of glass fibers 20a which are embedded in a matrix (schematically indicated). The glass fibers are placed in the longitudinal direction of torsion rod 20. Glass fibers 20a feature a high strength in the longitudinal direction so that torsion rod 20 is provided with the required flexural stiffness, but nevertheless remains torsionally soft in order to convert the force of piezoceramic fibers 30 into a torsional motion.

Piezoceramic fibers 30 are wound parallel to each other at an angle of 45° to the longitudinal direction of torsion rod 20. Electrodes 40, which also run parallel to each other, are wound on torsion rod 20 at an angle of 135° or −45° with respect to the longitudinal direction. Thus, electrodes 40 and piezoceramic fibers 30 cross each other, forming an angle of 90° at their contact points. In this context, piezoceramic fibers 30 can be wound on first and after that electrodes 40; however, it is also possible to wind on electrodes 40 first and then piezoceramic fibers 30. Moreover, several layers can be arranged one above the other.

The electrodes are driven via an electric circuit 50 by which an electric voltage is applied to electrodes 40 in sections so that individual sectors (sections) of piezoceramic fibers 30 can be driven, contributing to a torsional motion of torsion element 10. The performance of torsion element 10 is controlled by the number of piezoceramic fibers 30 per length section of torsion element 10.

In order to increase applicability and flexibility, electrodes 40 and piezoceramic fibers 30 can be electrically insulated from torsion rod 20 and from the environment with separate insulating layers, respectively (not shown here for the sake of clarity).

Figure 2:
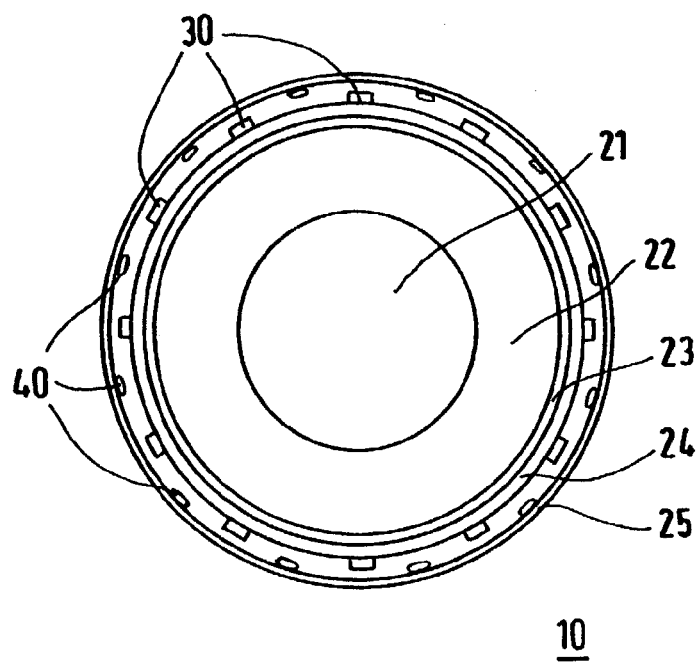
FIG. 2 is a cross-section through a torsion element according to the present invention, including a flexurally stiff core and a torsionally soft shell.

FIG. 2 shows a section through a torsion element 10, in which electrodes 40 and piezoceramic fibers 30 are electrically separated from torsion rod 20 and from the environment by an insulating layer 24, 25, respectively. The Figure depicts the cross-section of torsion element 10 at a location outside the contact points of electrode 40 and piezoceramic fibers 30, which is why they are located in different layers, but have no contact. In the embodiment shown, torsion rod 20 is composed of a compressionally rigid and flexurally stiff core 21, which can be made of metal, such as titanium. This core 21 is surrounded by an elastomer as a tough, compressionally rigid material 22 which, in turn, is surrounded by a shell 23. The latter is a plastic material, such as epoxy resin or rubber, for embedding the piezoceramic fibers.

Through this layered design, the requirements of being torsionally soft, but nevertheless flexurally stiff that are placed on torsion rod 20 are divided among different materials in different regions of torsion rod 20. In this context, core 21 assumes the load-bearing role with regard to flexural stiffness, whereas a torsion of shell 23 is hardly subject to resistance because of tough material 22.

Figure 3:
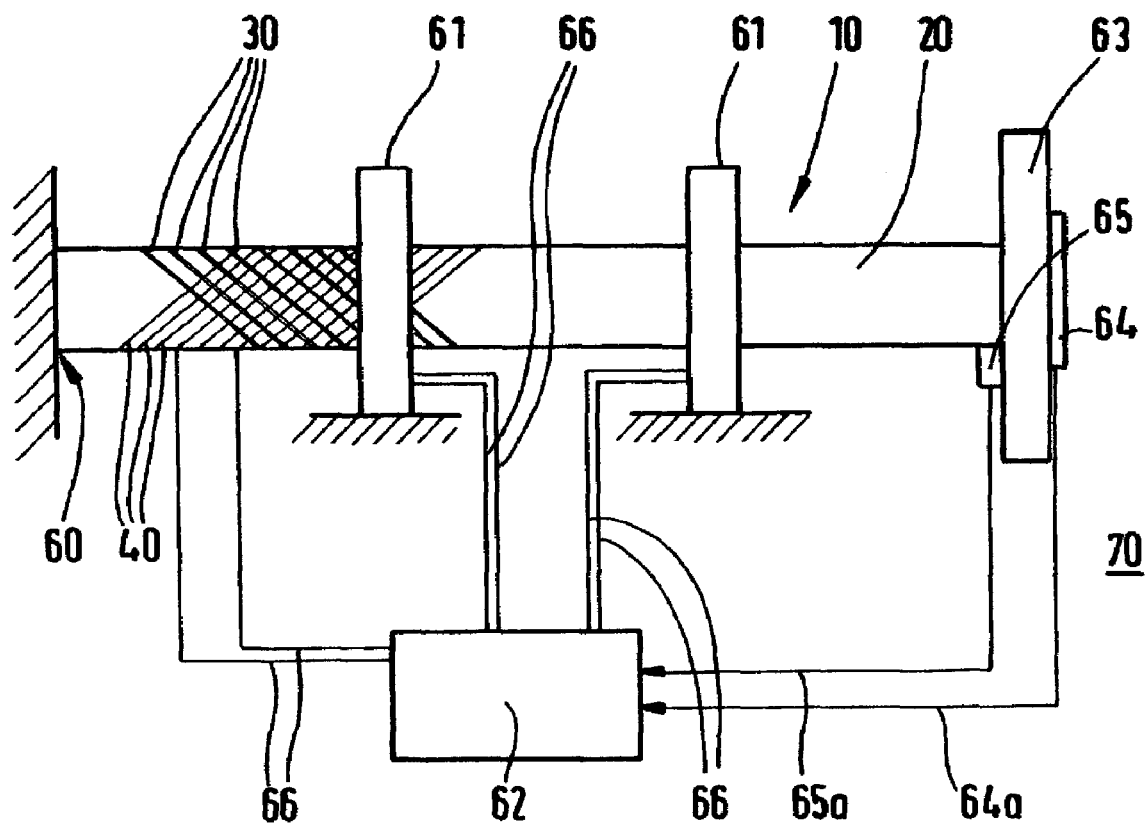
FIG. 3 depicts a torsional actuator according to the present invention, including a torsion element.

FIG. 3 shows a torsional actuator 70 including a torsion element 10, which allows the torsional moment produced by torsion element 10 to be picked up in a simple manner for utilization.

To this end, torsion element 10 is held by a fixed bearing 60 at the end shown here on the left, and the torsional motion is picked up via a gearing 63 mounted at the right, freely movable end of torsion element 10. Between the ends, torsion element 10 is additionally supported by two floating bearings 61. This further suspension stabilizes torsional actuator 70 to the effect that the torsional motion of torsion element 10 can be fully used without any twisting.

Moreover, floating bearings 61 and the contact occurring there between torsion element 10 and floating bearings 61, also provide a good way to drive piezoceramic fibers 30 (only sketched in the Figure), which are wound on torsion element 10, via electrodes 40 (likewise only sketched) contacting the piezoceramic fibers. However, the application of a voltage to electrodes 40 can also be accomplished outside of floating bearings 61, as is indicated between fixed bearing 60 and left floating bearing 61.

For open- and closed-loop control of torsional actuator 70, angle measurement device 65 and torque measurement device 64, which analyze the rotary motion, are mounted at gearing 63, which serves for picking up the rotary motion, and which, in the present case, is a gear that is coupled to free end of torsion element 10. For control purposes, signals 64 a, 65 a obtained in this manner are compared to the setpoint value in a control unit 62, and electrodes 40, and thus piezoceramic fibers 30, are driven 66 until the setpoint value is reached. This can be accomplished, first of all, in that electrodes 40 are initially driven in sections, whereby the torsional motion is performed only in a section of torsion element 10, and in that an increase in the rotary motion is achieved either by bringing further sections into circuit or by increasing the applied voltage, or by doing both.

In order to further increase the rotary power of the torsional motion to be picked up, it is further possible to connect additional torsion elements 10 in series and/or to telescope a plurality of torsion elements into each other. In this context, the torsional motion of the torsion elements is then added to that of the preceding torsion elements, adding up the motions.

It is also possible to carry out an oscillating rotary motion as needed through appropriate control via control unit 62.

What is claimed is:

1. A torsion element comprising:
   a torsion rod;
   a plurality of piezoceramic fibers wound on the torsion rod; and
   a plurality of electrodes wound on the torsion rod crosswise at an angle a with the respect to the plurality of piezoceramic fibers and contacting the piezoceramic fibers.

2. The torsion element as recited in claim 1 wherein the torsion rod is torsionally soft and flexurally stiff.

3. The torsion element as recited in claim 1 wherein the angle a is 90 degrees.

4. The torsion element as recited in claim 1 wherein the plurality of electrodes are configured to have an electric voltage applied in sections of the electrodes along a longitudinal direction.

5. The torsion element as recited in claim 1 wherein the piezoceramic fibers and the electrodes are electrically insulated from at least one of the torsion rod and a surrounding environment.

6. The torsion element as recited in claim 1 wherein the torsion rod includes fibers in a fiber-reinforced plastic, the fibers being aligned in a longitudinal direction.

7. The torsion element as recited in claim 1 wherein the torsion rod includes a compressionally rigid and flexurally stiff core and having a torsionally soft shell.

8. The torsion element as recited in claim 7 wherein the torsion rod includes a layer of tough material between the core and the shell.

9. The torsion element as recited in claim 8 wherein the tough material is one of an elastomer and a foam.

10. A torsional actuator, comprising:
    a torsion element including a torsion rod, a plurality of piezoceramic fibers wound on the torsion rod, and a plurality of electrodes wound on the torsion rod crosswise at an angle a with the respect to the plurality of piezoceramic fibers and contacting the piezoceramic fibers;
    a fixed bearing clamping the torsional element; and
    a gearing operatively connected to a free end of the torsional element for converting a motion of the torsional element.

11. The torsional actuator as recited in claim 10, further comprising at least one first floating bearing supporting the torsion element between the fixed bearing and the free end.

12. The torsional actuator as recited in claim 10 further comprising second free end and at least one second floating bearing rotatably supporting the torsion element between the fixed bearing and the second free end.

13. The torsional actuator as recited in claim 10, wherein the gearing includes a gear mounted on the free end in a torsionally fixed manner.

14. The torsional actuator as recited in claim 10 further comprising a control unit operatively connected to an angle measurement device and a torque measurement device, the control unit converting a torsional motion of the torsion element into drive signals for the electrodes.

* * * * *